(12) United States Patent
Toda et al.

(10) Patent No.: US 7,297,635 B2
(45) Date of Patent: Nov. 20, 2007

(54) PROCESSING METHOD (75) Inventors: Akihito Toda, Nirasaki (JP); Kazuto Ogawa, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 10/490,201

(22) PCT Filed: Sep. 6, 2002

(86) PCT No.: PCT/JP02/09130

§ 371 (c)(1),
(2), (4) Date: Apr. 20, 2004

(87) PCT Pub. No.: WO03/030238

PCT Pub. Date: Apr. 10, 2003

(65) Prior Publication Data

US 2004/0259356 A1    Dec. 23, 2004

(30) Foreign Application Priority Data

Sep. 26, 2001 (JP) .............................. 2001-295187

(51) Int. Cl.
*H01L 21/311* (2006.01)
*H01L 21/302* (2006.01)

(52) U.S. Cl. ............... 438/706; 438/710; 438/714; 438/725; 216/49; 216/67; 216/79

(58) Field of Classification Search .......... 216/49, 216/67, 79; 438/706, 710, 714, 724, 725; 156/345.1, 345.46

See application file for complete search history.

(56) References Cited

U.S. PATENT DOCUMENTS

| | | | |
|---|---|---|---|
| 6,207,583 B1 * | 3/2001 | Dunne et al. | 438/725 |
| 6,277,733 B1 * | 8/2001 | Smith | 438/636 |
| 6,325,861 B1 * | 12/2001 | Stinnett | 134/2 |
| 6,379,574 B1 * | 4/2002 | Ou-Yang et al. | 216/49 |
| 6,383,964 B1 * | 5/2002 | Nakahara et al. | 501/152 |
| 6,468,898 B1 * | 10/2002 | Usami | 438/638 |
| 6,554,004 B1 * | 4/2003 | Nguyen et al. | 134/1.3 |
| 2001/0003271 A1 | 6/2001 | Otsuki | |

FOREIGN PATENT DOCUMENTS

| | | |
|---|---|---|
| JP | 63-216346 | 9/1988 |
| JP | 11-097421 | 4/1999 |
| JP | 11-97421 | 4/1999 |
| JP | 2001-085411 | 3/2001 |
| JP | 2001-118830 | 4/2001 |

OTHER PUBLICATIONS

Wolf, Silicon Processing for the VLSI Era, 2002, Lattice Press, vol. 4, pp. 639, 651-654.*

* cited by examiner

*Primary Examiner*—Duy-Vu N Deo
(74) *Attorney, Agent, or Firm*—Oblon, Spivak, McClelland, Maier & Neustadt, P.C.

(57) ABSTRACT

A processing method which, when an organic film layer such as a PR film layer 202 formed on the surface of a wafer W is to be removed from an $SiO_2$ film layer 204 below it by generating plasma of a process gas in a chamber 1 comprises the step of using $O_2$ gas as the process gas to remove the organic film layer at a first pressure, e.g., 20 mTorr, lower than in a conventional case, and the step of using the same $O_2$ gas to remove the organic film layer at a second pressure, e.g., 200 mTorr, higher than the first pressure.

16 Claims, 5 Drawing Sheets

PROCESSING METHOD

FIELD OF THE INVENTION

The present invention relates to a processing method; and, more particularly, to a method for removing an organic film layer formed on a surface of an object to be processed by generating a plasma of a process gas in a vacuum processing vessel.

BACKGROUND OF THE INVENTION

In forming a wiring of a semiconductor integrated circuit, there is included a process of forming, e.g., a contact hole or a groove for wiring. In such a process, a resist film layer and an anti-reflection coating film layer are formed on an insulating film layer made of, e.g., silicon oxide, and, further, a pattern for the contact hole or the groove is formed thereon by using a photolithography technique, after which an etching is performed by using a plasma processing apparatus according to the pattern, to thereby form the contact hole or the groove. Next, an ashing is carried out by using the same or a different plasma processing apparatus to remove the resist film layer.

Figure 5A:
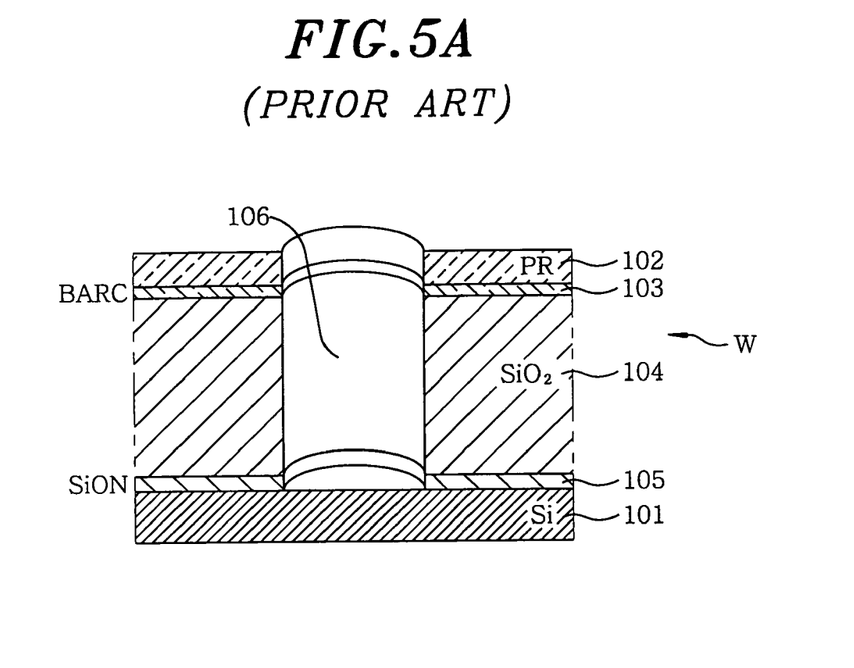
FIGS. 5A and 5B depict a cross sectional views for illustrating an ashing process of a PR film layer according to a conventional processing method by using the etching apparatus illustrated in FIG. 1.
Figure 5B:
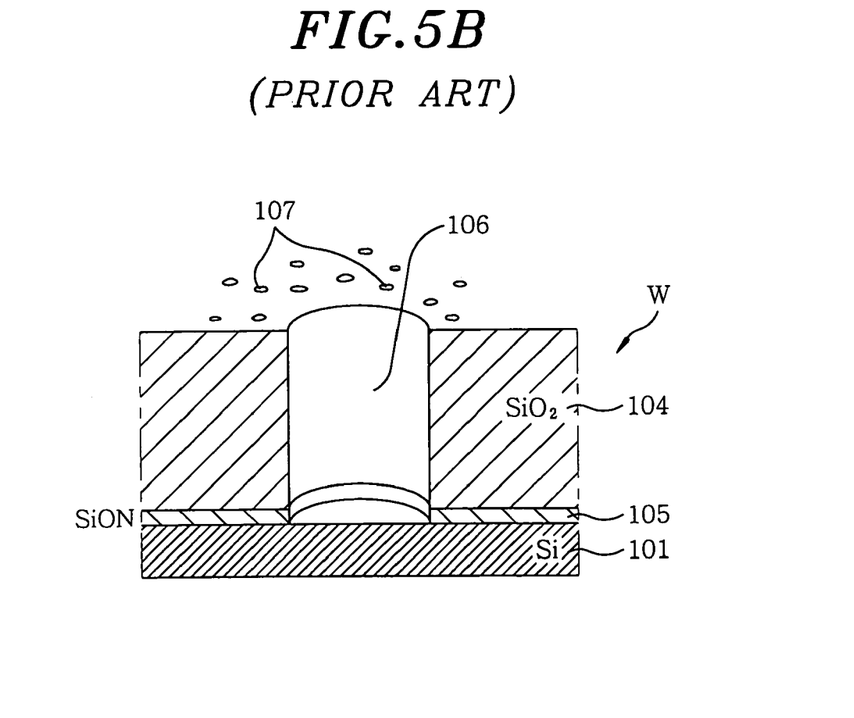

FIGS. 5A and 5B describe a conventional ashing process. There is shown in FIG. 5A a structure having, starting from top to bottom, a photoresist film layer (PR film layer) 102, an anti-reflection film layer [BARC (bottom anti-reflection coating) layer] 103, a silicon oxide film layer ($SiO_2$ film layer) 104 and a silicon oxy nitride film layer (SiON film layer) 105 formed on a silicon layer 101 of a wafer. The $SiO_2$ film layer 104 and the SiON film layer 105 incorporate a contact hole 106 formed by etching. In ashing the PR film layer 102 shown in FIG. 5A, the PR film layer 102 along with the BARC layer 103 formed on the $SiO_2$ film layer 104, is removed thereby. For such conventional processing, a chamber made of, e.g., alumite-treated aluminum or alumina, is used as a vacuum processing vessel of the plasma processing apparatus.

In executing such processing, there is a problem of contaminant generation due to damages on chamber material by the plasma incurring with age. In particular, in a case of the chamber being made of aluminum or a material containing aluminum such as alumina, the etching performed by using a fluorine-based gas results in a generation of particles such as aluminum fluoride. To solve such problem, recently a chamber having an inner surface thereof thermally sprayed with ceramic such as yttria ($Y_2O_3$) has been employed to improve plasma resistance, which in turn stretches a periodic cleaning cycle of the chamber.

In a case of such chamber being treated with the ceramic thermal spray, e.g., a yttria thermal spray, the etching is performed by using a predetermined etching gas to form the contact hole 106 at the $SiO_2$ film layer 104, as shown in FIG. 5A, and, subsequently, the ashing is executed by using, e.g., an $O_2$ gas, at a predetermined pressure of, e.g., 200 mTorr, to thereby remove the PR film layer 102, as shown in FIG. 5B. In this case, however, crater-shaped holes 107 (hereinafter, referred to as craters for simplicity) formed by an abnormal etching are found at a surface of the $SiO_2$ film layer 104, particularly, around the contact hole 106.

SUMMARY OF THE INVENTION

It is, therefore, an object of the present invention to provide a processing method capable of preventing the generation of craters at a lower film layer formed beneath an organic film layer due to an abnormal etching during an ashing of the organic film layer to remove same from the film layer within a vacuum processing chamber, wherein the vacuum processing chamber is treated with a ceramic thermal spray including a metallic component, such as yttria thermal spray, in order to enhance plasma-resistance.

In accordance with a preferred embodiment of the present invention, there is provided in claim 1 a processing method for removing an organic film layer formed on a surface of an object to be processed by generating a plasma of a process gas within a vacuum processing chamber, including the steps of: removing the organic film layer by employing the process gas under a first pressure; and removing the organic film layer by using the process gas under a second pressure, which is higher than the first pressure.

There is described in claim 2 of the present invention the processing method, wherein the first pressure is set to be equal to or lower than 100 mTorr.

There is described in claim 3 of the present invention the processing method, wherein an overprocessing rate of the organic film layer is set to be equal to or lower than 15%

There is described in claim 4 of the present invention the processing method, wherein sum of the overprocessing rates of the organic film layer at the first pressure and at the second pressure is set to be equal to or lower than 100%.

There is described in claim 5 of the present invention the processing method, wherein the process gas includes at least an $O_2$ gas.

There is described in claim 6 of the present invention the processing method, wherein the $O_2$ gas is used as the process gas.

There is described in claim 7 of the present invention the processing method, wherein a gaseous mixture of $N_2$ and $O_2$ is used as the process gas.

There is described in claim 8 of the present invention the processing method, wherein the process gas includes at least one of N and H.

There is described in claim 9 of the present invention the processing method, wherein a portion of the vacuum processing chamber having contact with the plasma includes a metallic component.

There is described in claim 10 of the present invention the processing method, wherein the metallic component is yttrium.

There is described in claim 11 of the present invention the processing method, wherein the portion containing the metallic component is yttrium oxide.

There is described in claim 12 of the present invention the processing method, wherein the organic film layer is a resist layer.

There is described in claim 13 of the present invention the processing method, wherein a silicon oxide film layer is formed beneath the organic film layer.

There is described in claim 14 of the present invention the processing method, wherein the silicon oxide film layer is one of a carbon-containing silicon oxide film layer, a fluorine-containing silicon oxide film layer and a hydrogen-containing silicon oxide film.

There is described in claim 15 of the present invention the processing method, wherein one of a silicon nitride film layer, a polysilicon film layer and a metal film layer is formed beneath the organic film layer.

In accordance with another preferred embodiment of the present invention, there is provided a processing method for removing an organic film layer formed on a surface of an object to be processed by generating a plasma of a process gas within a vacuum processing chamber, including the step of removing the organic film layer at a pressure of equal to or lower than 100 mTorr.

There is described in claim 17 of the present invention the processing method, wherein an overprocessing rate of the organic film layer is set to be equal to or lower than 15%.

There is described in claim 18 of the present invention the processing method, wherein a process gas includes at least an $O_2$ gas.

There is described in claim 19 of the present invention the processing method, wherein the $O_2$ gas is used as the process gas.

There is described in claim 20 of the present invention the processing method, wherein a gaseous mixture of $N_2$ and $O_2$ is used as the process gas.

There is described in claim 21 of the present invention the processing method, wherein the process gas includes at least one of N and H.

There is described in claim 22 of the present invention the processing method, wherein a portion of the vacuum processing chamber having contact with the plasma includes a metallic component.

There is described in claim 23 of the present invention the processing method, wherein the metallic component is yttrium.

There is described in claim 24 of the present invention the processing method, wherein the portion containing the metallic component is yttrium oxide.

There is described in claim 25 of the present invention the processing method, wherein the organic film layer is a resist layer.

There is described in claim 26 of the present invention the processing method, wherein a silicon oxide film is formed beneath the organic film layer.

There is described in claim 27 of the present invention the processing method, wherein the silicon oxide film layer is one of a carbon-containing silicon oxide film layer, a fluorine-containing silicon oxide film layer and a hydrogen-containing silicon oxide film.

There is described in claim 28 of the present invention the processing method, wherein one of a silicon nitride film layer, a polysilicon film layer and a metal film layer is formed beneath the silicon oxide film layer.

DETAILED DESCRIPTION OF THE PREFERRED EMBODIMENT

Referring to FIGS. 1 to 4B, the preferred embodiment of the present invention will now be described in detail.

Figure 1:
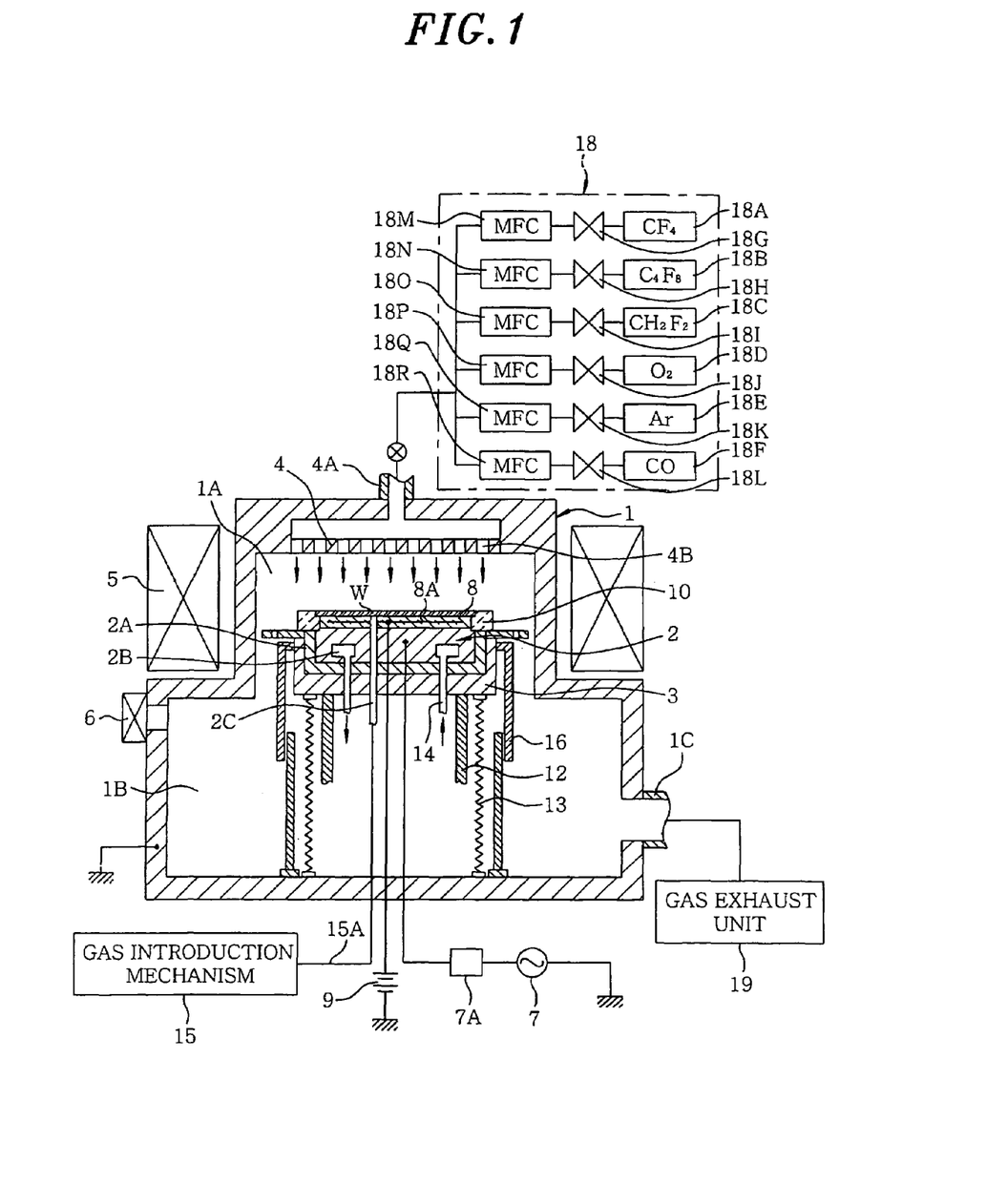
FIG. 1 offers an arrangement of a magnetron RIE type etching apparatus for executing a processing method in accordance with the present invention.

FIG. 1 offers a schematic cross sectional view of a magnetron RIE type etching apparatus (hereinafter, referred to as a processing apparatus for simplicity) for carrying out a processing method in accordance with the present invention. The processing apparatus includes a chamber 1 made of aluminum and having an inner surface thereof treated with a thermal spray coating of yttria; a vertically movable support 3 made of aluminum, for supporting a lower electrode 2 via an insulating member 2A; and a shower head 4 disposed above the support 3, for supplying a process gas and also serving as an upper electrode 4 (hereinafter, referred to as an upper electrode, when necessary).

The chamber 1 in an upper part thereof has an upper room 1A with a smaller diameter relative to a lower room 1B with a larger diameter in a lower part thereof. The upper room 1A is surrounded with a dipole ring magnet 5. The dipole ring magnet 5 has a plurality of anisotropic cylindrical segment magnets arranged in a ring-shaped casing made of a magnetic material, which creates as a whole a substantially uniform horizontal magnetic field directed in a single direction in the upper room 1A. Formed at an upper part of the lower room 1B is an opening for transferring the wafer W therethrough, and at which a gate valve 6 is installed. The lower electrode 2 is connected to a high frequency power supply 7 of 13.56 MHz via a matching unit 7A, and a predetermined voltage is applied to the lower electrode 2 from the high frequency power supply 7, to thereby form a vertical electric field between the lower electrode 2 and the upper electrode 4 in the upper room 1A. Accordingly, a magnetron discharge is generated by the vertical electric field formed by the high frequency power supply 7 and the horizontal magnetic field formed by the dipole ring magnet 5, via a process gas, and, as a result, a plasma of the process gas supplied into the upper room 1A is generated.

Disposed on an upper surface of the lower electrode 2 is an electrostatic chuck 8 having an electrode plate 8A embedded therein and the electrode plate 8A is connected to a high voltage DC power supply 9. By applying a high voltage from the high voltage DC power supply 9 to the electrode plate 8A under a high vacuum state, the wafer W is electrostatically adsorbed by the electrostatic chuck 8. On an upper peripheral portion of the lower electrode 2, there is provided a focus ring 10, made of a single crystalline silicon, for confining the plasma generated in the upper room 1A above the wafer W. Further, there is provided beneath the focus ring 10 an exhaust ring 11 installed on top of the support 3. The exhaust ring 11 has a plurality of holes being nearly equi-distanced along an entire periphery thereof, through which the gas in the upper room 1A is discharged to the lower room 1B.

The support 3 can be raised and lowered between the upper room 1A and the lower room 1B via a ball screw mechanism 12 and a bellows 13. When loading the wafer W onto the lower electrode 2, the lower electrode 2 is lowered with the support 3 via a ball screw mechanism 12 into the lower room 1B. Then the gate valve 6 is opened and a transferring mechanism (not shown) loads the wafer W onto the lower electrode 2. In executing a processing of the wafer W, first the lower electrode 2 is raised with the support 3 via the ball screw mechanism 12, to satisfy a predetermined spacing between the lower electrode 2 and the shower head 4 for performing the processing of the wafer W. There is formed a coolant passageway 2B connected to a coolant line 14 in the lower electrode 2, through which a coolant introduced from the coolant line 14 is circulated to thereby adjust the wafer W to a predetermined temperature. Furthermore, respective gas channel 2C is formed in a susceptor 3, the insulating member 2A, the lower electrode 2 and the electrostatic chuck 8. The gas channel 2C supplies therethrough, e.g., a He gas supplied from a gas introduction mechanism 15 through a gas pipe 15A to a slit between the electrostatic chuck 8 and the wafer W as a backside gas at a predetermined pressure, by which heat transfer between the electrostatic chuck 8 and the wafer W is enhanced. Meanwhile, the reference numeral 16 denotes a bellows cover.

Prepared at a top portion of the shower head 4 is a gas inlet opening 4A connected to a gas supplying system 18 via a line 17. The gas supplying system 18 has a $CF_4$ gas source 18A, a $C_4F_8$ gas source 18B, a $CH_2F_2$ gas source 18C, an $O_2$ gas source 18D, an Ar gas source 18E and a CO gas source 18F. These gas sources 18A, 18B, 18C, 18D, 18E and 18F supply respective gases thereof to the shower head 4 through valves 18G, 18H, 18I, 18J, 18K and 18L and mass flow controllers 18M, 18N, 18O, 18P, 18Q and 18R, respectively. A gas supplied to the shower head 4 may be a single gas or plural kinds of gases having predetermined flow rates depending on the process phase, wherein the plural kinds of gases are mixed in the shower head 4 to form a gaseous mixture having a specified flow rate ratio. A plurality of holes 4B are formed at an entire bottom surface of the shower head 4 to be uniformly distributed thereat, through which the gaseous mixture from the shower head 4 is supplied into the upper room 1A as a process gas. Meanwhile, a reference numeral 1C represents a gas exhaust line 1C and a reference numeral 19 represents a gas exhaust unit including therein, e.g., a vacuum pump connected to the gas exhaust line 1C.

Figure 2A:
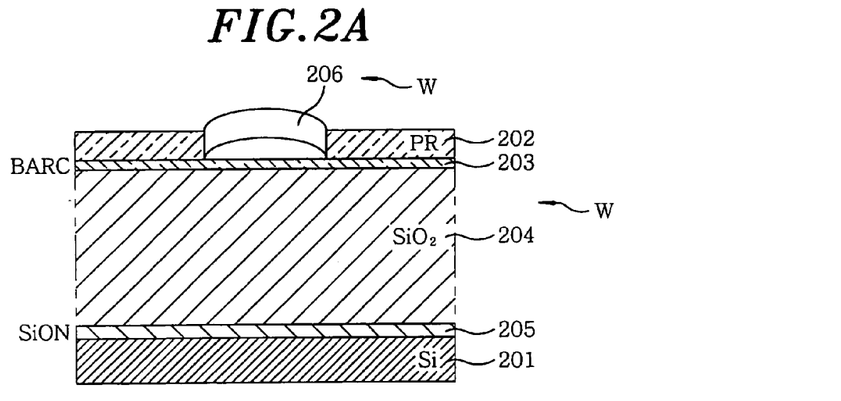
FIGS. 2A to 2C show cross sectional views for setting forth a contact hole formation process by using the etching apparatus illustrated in FIG. 1.
Figure 2B:
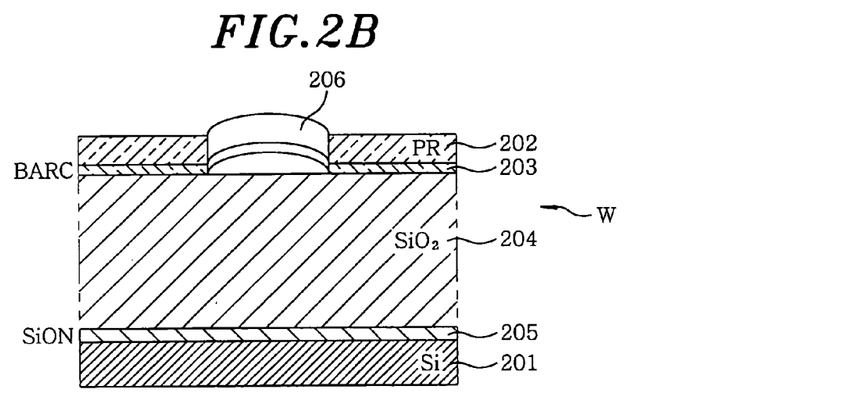
Figure 2C:
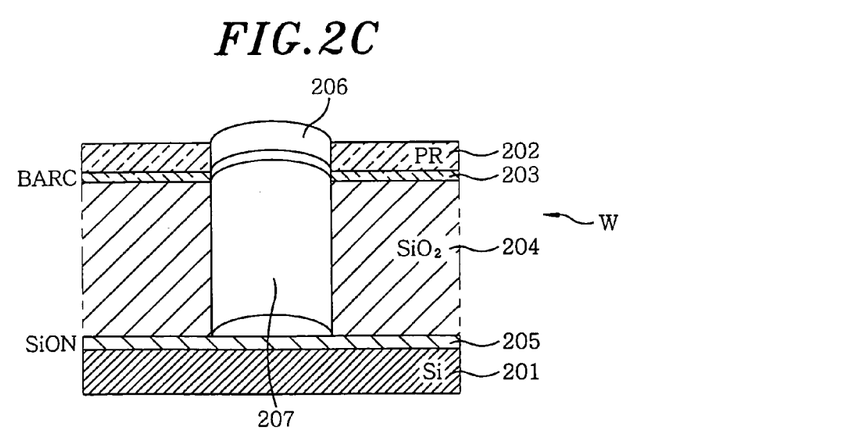
Figure 3A:
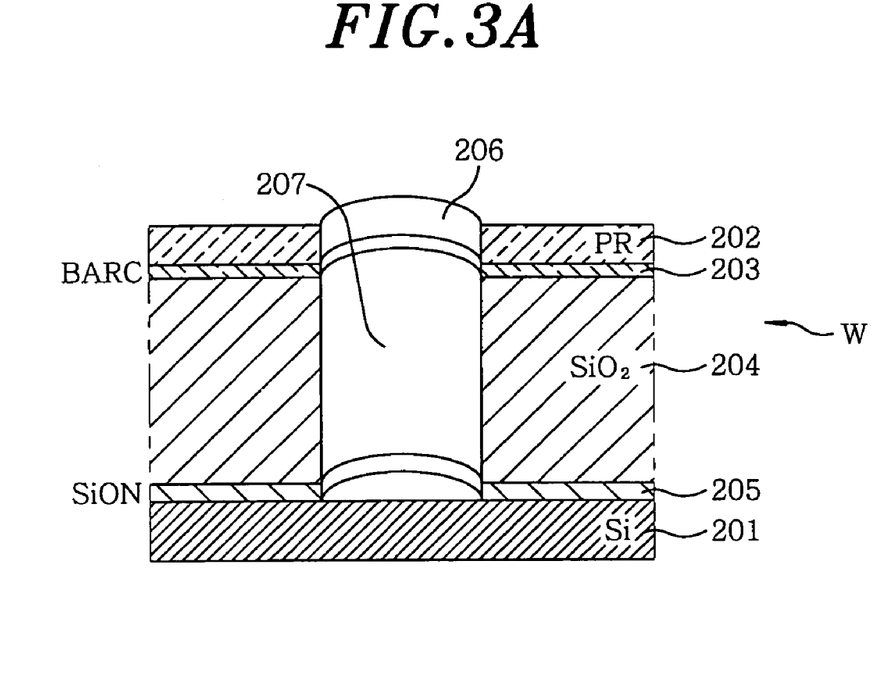
FIGS. 3A and 3B illustrate cross sectional views for setting forth an ashing process of a PR film layer according to the processing method of the present invention by using the etching apparatus in FIG. 1.
Figure 3B:
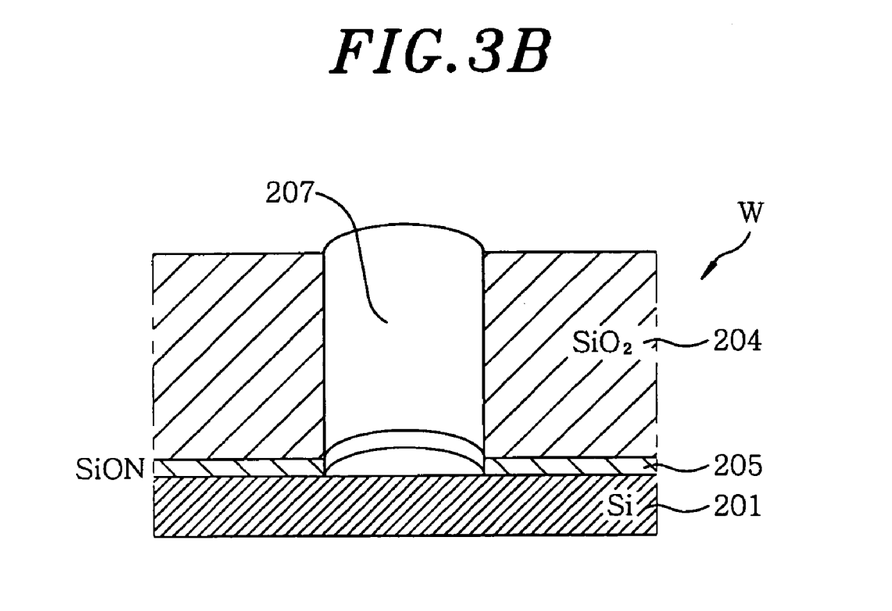

Hereinafter, a processing method by using the above-described processing apparatus in accordance with a preferred embodiment of the present invention will be described in detail with reference to FIGS. 2A to 4B. There are illustrated in FIGS. 2A to 2C; FIGS. 3A and 3B; and FIGS. 4A and 4B a contact hole forming process, a photoresist layer (PR film layer) ashing process and a shoulder portion of the contact hole, respectively.

First, the contact hole forming process by using the above-described processing apparatus will now be described in detail with reference to FIGS. 2A to 2C. As shown in FIG. 2A, there are shown on a silicon layer 201 of the wafer W starting from top to bottom a PR film layer 202, an anti-reflection film layer [BARC (bottom anti-reflection coating) layer] 203, a silicon oxide film layer ($SiO_2$ film layer) 204 and a silicon oxy nitride film layer (SiON film layer) 205 formed in a previous process. The PR film layer 202 contains a lithographed pattern 206 of a contact hole.

In the contact hole forming process, the wafer W is etched to form the contact hole by using the aforementioned processing apparatus under the conventional etching conditions, as illustrated in FIGS. 2A to 2C. First, The BARC layer 203 is etched away. Specifically, the valves 18G, 18J and 18K corresponding to the $CF_4$ gas source 18A, the $O_2$ gas source 18D and the Ar gas source 18E of the gas supplying system 18 respectively are opened to be connected to the upper electrode 4, while respective flow rates thereof are set to be predetermined rates (e.g., $CF_4/O_2/Ar=80/20/160$ sccm) by the corresponding mass flow controllers 18M, 18P and 18Q, respectively. Then the process gases are supplied to the upper electrode 4. An ambient pressure of the chamber 1 is set to be, e.g., 40 mTorr by using the gas exhaust unit 19. Under the existing state, by applying a high frequency power of, e.g., 1500 W, to the lower electrode 2, a plasma of a gaseous mixture of the $CF_4$, the $O_2$ and the Ar gases is generated between the lower electrode 2 and the upper electrode 4, and the BARC layer 203 is etched away by the plasma generated thereby (See FIG. 2B).

Upon completion of the etching of the BARC layer 203, the residual gas is purged and the process gas is replaced to form the contact hole in the $SiO_2$ film layer 204. First, the $C_4F_8$ gas source 18B, the $O_2$ gas source 18D and the Ar gas source 18E of the gas supplying system 18 are connected to the upper electrode 4 in a similar manner as the above, wherein the flow rates of these process gases are set to be, e.g., $C_4F_8/O_2/Ar=6/3/500$ sccm, while setting an ambient pressure of the chamber 1 at, e.g., 60 mTorr. Under such arrangement, a high frequency power of, e.g., 1500 W, is applied to the lower electrode 2, to thereby generate a plasma of a gaseous mixture of the $C_4F_8$, the $O_2$ and the Ar gases, by which the $SiO_2$ film layer 204 is etched to form a contact hole 207 (see FIG. 2C).

Following the etching of the $SiO_2$ film layer 204, an overetching thereof is performed. The residual gas is purged, and the process gas is introduced by connecting the $C_4F_8$ gas source 18B, the CO gas source 18F and the Ar gas source 18E to the upper electrode 4, in a manner shown above, wherein the flow rates of these process gases are set to be, e.g., $C_4F_8/CO/Ar=12/360/280$ sccm, while an ambient pressure of the chamber 1 is set to be, e.g., 45 mTorr. Under the existing state, application of a high frequency power of, e.g., 1500 W, to the lower electrode 2 generates a plasma of a gaseous mixture of the $C_4F_8$, the CO, the Ar gases, by which the $SiO_2$ film layer 204 is overetched. At this stage, etching residues are attached to the SiON film layer 205.

Thereafter, an etching is performed to remove the etching residues on the SiON film layer 205. The process gas is replaced with an $O_2$ and an Ar gas by connecting the $O_2$ gas source 18D and the Ar gas source 18E to the upper electrode 4 in a similar manner as in the method described above, wherein the flow rates of these process gases are set to be, e.g., $O_2/Ar=20/100$ sccm, while an inner pressure of the chamber 1 is set to be, e.g., 40 mTorr. Under this state, a high frequency power of, e.g., 500 W, applied to the lower electrode 2 causes the generation of a plasma of a gaseous mixture including the $O_2$ and the Ar gases. By briefly etching using the plasma, the depositions on the $SiO_2$ film layer 205 are removed.

Next, an etching of the SiON film layer 205 is performed. The residual gas is purged and the process gas is replaced, after which an etching of the SiON film layer 205 begins. The $CH_2F_2$ gas source 18C, the $O_2$ gas source 18D and the Ar gas source 18E are connected to the upper electrode 4, wherein the flow rates of these process gases are set to be, e.g., $CH_2F_2/O_2/Ar=20/10/100$ sccm and, while an ambient pressure of the chamber 1 is set to be, e.g., 80 mTorr. At such stage, by applying a high frequency power of, e.g., 500 W, to the lower electrode 2, a plasma of a gaseous mixture of the $CH_2F_2$, the $O_2$ and the Ar gases is generated, by which the SiON film layer 205 shown in FIG. 2C is etched away, thereby forming the contact hole 207, as illustrated in FIG. 3A.

After the formation of the contact hole, the PR film layer 202 is ashed in the same chamber 1 in accordance with the processing method of the present invention. First, the residual gas is purged and the process gas is replaced by connecting the $O_2$ gas source 18D to the upper electrode 4 in a similar manner as the above. The pressure and flow rate of $O_2$ gas are set to be predetermined levels appropriate to execute the processing method in accordance with the present invention. Under the existing state, a high frequency power of, e.g., 300 W, is applied to the lower electrode 2 and the PR film layer 202 is ashed by a plasma of the $O_2$ gas, to be completely removed, and thus transforming from a state shown in FIG. 3A to a state shown in FIG. 3B. In the present embodiment, the $O_2$ gas is solely used as the process gas, but a gaseous mixture of the $O_2$ gas and another gas, e.g., a gas mixed with an $N_2$ gas, or a gas including at least one of N and H, e.g., an $NH_3$ gas or a gaseous mixture of the $N_2$ gas and a $H_2$ gas may be used therefor, i.e., any gas, which enables the ashing of the PR film layer 202, can be used as the process gas.

Figure 4A:
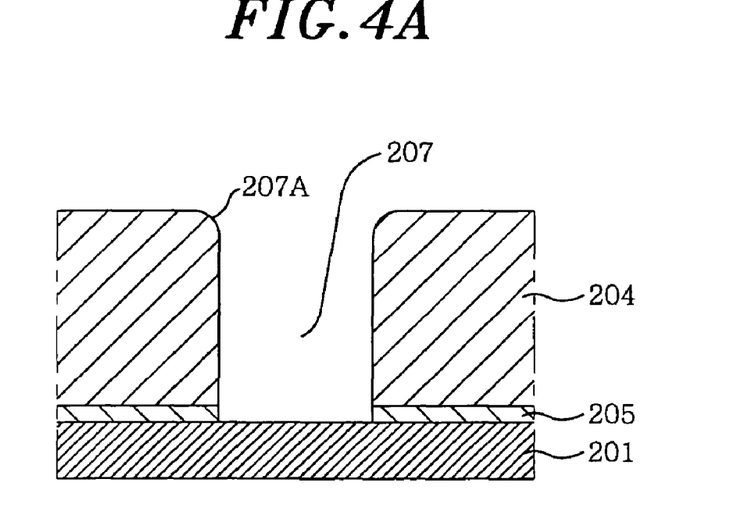
FIGS. 4A and 4B describe views for setting forth shoulder loss of the contact hole formed by the processes described in FIGS. 2A to 2C and FIGS. 3A and 3B.

In the processing method of the present invention, it is preferable to complete the ashing process of the PR film layer 202 in two steps. Specifically, the processing method of the present invention includes a first process of ashing the PR film layer 202 at a first pressure by using the $O_2$ gas and a second process of ashing the PR film layer 202 at a second pressure higher than the first pressure by using the $O_2$ gas. The first pressure is preferably not greater than 100 mTorr, which is much lower than that of the conventional method (e.g., 200 mTorr), and most preferably within the range from 20 to 50 mTorr. Since the first pressure is set to be equal to or lower than 100 mTorr, an abnormal etching due to yttrium can be prevented, to thereby remove the PR film layer 202 creating craters around the contact hole 207 even though 202 is contaminated by yttria cause by the yttria thermal sprayed portion of the chamber 1 to generate therein a metal contamination. If the first pressure is higher than 100 mTorr, there may be a problem of the crater generation around the contact hole 206 due to yttrium contamination. While an excessively low first pressure may suppress the generation of the craters, such low pressure may increase shoulder loss 207A of the contact hole 207, as illustrated in FIG. 4A.

Figure 4B:
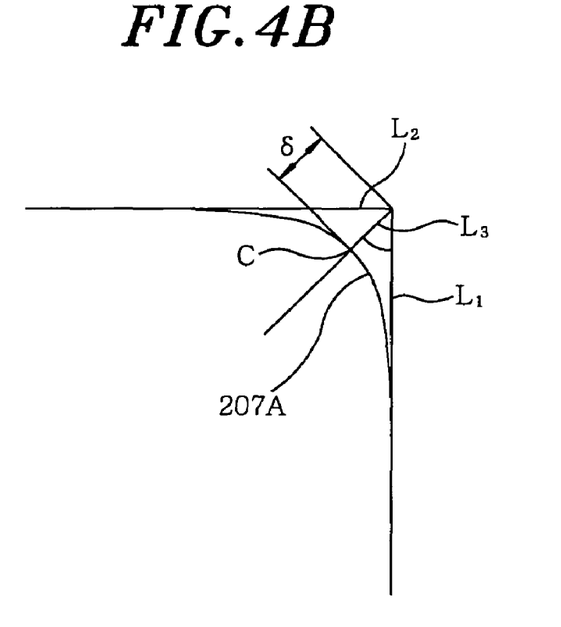

The shoulder loss 207A is quantitatively defined as follows. A line extended from a sidewall of the contact hole 207, as shown in FIG. 4B, is represented as $L_1$, and a line extended from an opening portion of the contact hole 207 is represented as $L_2$. A line bisecting an angle (of about 90°) formed by the lines $L_1$ and $L_2$ is represented as $L_3$. A point where the line $L_3$ meets the shoulder portion is designated as an intersection point C. The shoulder loss is defined as a length δ of the line $L_3$ between the intersection point C and an intersecting point of the lines $L_1$ and $L_2$. Therefore, it is preferable that the contact hole 207 has small shoulder loss, as described above.

Furthermore, in order to minimize the shoulder loss, the second pressure is preferably set high, e.g., higher than 100 mTorr, i.e., within the range from 200 to 300 mTorr. Moreover, it is preferable that the first pressure is switched to the second pressure at a point when the PR film layer 202 is completely ashed under the first pressure (hereinafter, referred to as "just ashing"). A starting point of an overetching process can be determined by detecting a variation of a certain wavelength of an active species included in the plasma, such as $CO_2$, by using a conventional endpoint detector (not shown). However, it is not preferable to switch from the first pressure to the second pressure prior to the just ashing under the first pressure (lower than 100 mTorr), due to crater generation.

Furthermore, an overprocessing rate of the PR film layer 202 under the first pressure is preferably equal to or less than 15%, and more preferably, within the range from 0 to 10%. The overprocessing rate of the PR film layer 202 denotes a ratio of an overashed amount of the PR film layer 202 and the thickness thereof in percentage. If the overprocessing rate exceeds 15%, the shoulder loss 207A becomes large. Further, sum of the overprocessing rates of the PR film layer 202 under the first pressure and under the second pressure is preferably equal to or less than 100% and, more preferably, within the range from 50 to 100%. If the sum exceeds 100%, the shoulder loss becomes large.

In addition to the pressure of the $O_2$ gas in the chamber 1, the residence time thereof influences the generation of the craters. In case that the pressure of the $O_2$ gas is adjusted to first pressure (the pressure not greater than 100 mTorr), the generation of the craters is prevented with an increase in the residence time. On the other hand, in case that the pressure of the $O_2$ gas is adjusted to the second pressure (the pressure greater than 100 mTorr), the generation of the craters is prevented more effectively when the residence time is small. However, when the $O_2$ gas has the first pressure, the shoulder loss becomes large with an increase in the residence time. The residence time (τ) can be obtained by the following Equation 1.

$$\tau = V/S = pV/Q (m\ sec) \ldots \qquad \text{Eq. 1}$$

In this formula, V is a volume (L) obtained by multiplying the area of the wafer by the distance between the upper and the lower electrodes; S, an exhaust rate (L/sec) of the gas exhaust unit 19; p, an ambient pressure (Torr) of the chamber; and Q, a total flow rate of the gas, wherein 1 Torr·L/sec=79.05 sccm.

It is possible to conduct the ashing process and the overashing process of the PR film layer 202 only at the first pressure, i.e., the pressure not greater than 100 mTorr. In such case, the generation of the craters around the contact hole 207 can be prevented. However, as the residence time of $O_2$ gas increases, a problem of an increase shoulder loss may rise.

As explained above, in accordance with the present embodiment, when removing the PR film layer 202 formed on the wafer W by generating the plasma of the process gas in the chamber 1 having the inner surface thereof thermally sprayed with ceramic, such as yttria, the PR film layer 202 is removed first by using the $O_2$ gas as the process gas under the first pressure, e.g., the pressure not greater than 100 mTorr, and then, by using the same $O_2$ gas under the second pressure higher than the first pressure, e.g., the pressure greater than 100 mTorr. As a result, the generation of the craters by the abnormal etching at the $SiO_2$ film layer 204, particularly, around the contact hole 207 (see FIG. 5B) can be suppressed, while removing the resist film layer 202 from the $SiO_2$ film layer 204 by performing the ashing process after forming the contact hole 207 at the $SiO_2$ film layer 204 in the chamber 1 having an improved plasma resistance by a ceramic thermal spray treatment including a metallic component, such as yttria thermal spray treatment.

Furthermore, in accordance with the present invention, since the overprocessing rate of the PR film layer 202 under the first pressure, e.g., not greater than 100 mTorr, is set to be equal to or less than 15%, the shoulder loss can definitely be prevented. Further, since the sum of the overprocessing rates of the PR film layer 202 under the first pressure, e.g., not higher than 100 mTorr, and under the second pressure higher than, e.g., 100 mTorr, is set to be equal to or less than 100%, the generation of the craters can be prevented while minimizing the shoulder loss 207A of the contact hole 207. Moreover, even when the second process under the second pressure is omitted, the PR film layer 202 is removed under the pressure of $O_2$ gas lower than 100 mTorr and such will prevent the generation of the craters as well. A contact surface of the chamber 1 having contact with the plasma of the $O_2$ gas includes the metallic component, e.g., yttrium or yttria, to thereby prevent the generation of the craters around the contact hole 207. Moreover, if the $SiO_2$ film layer 204 has thereon the BARC layer 203 and the PR film layer 202 serving as organic film layers; the contact hole 207 can be completely formed with high accuracy.

In the present embodiment, the PR film layer 202 and the BARC layer 203 on the $SiO_2$ film layer 204 incorporating the contact hole 207 therein were ashed by applying the following process conditions to the processing apparatus. In these experiments, the respective process times under the first pressure and the second pressure were varied, while setting the final overashed amount under the first and the second pressures at 340%. Further, the total thickness of the PR film layer 202 and the BARC layer 203 was 780 nm. The ashing rate under the first pressure was 936 nm/min and that under the second pressure was 1140 nm/min.

EXAMPLE 1

In the present example, the first pressure of the $O_2$ gas was set to be 20 mTorr, and 'just ashing' of the PR film layer 202 and the BARC layer 203 was performed under the first pressure for duration of 50 seconds after which the second pressure was set to be 200 mTorr, and the ashing of the PR film layer 202 and the BARC layer 203 was performed under the second pressure for duration of 2 minutes and 19 seconds. As a result, no crater was generated around the contact hole 207 and the shoulder loss of the contact hole 207 was 30.4 nm.

[Process Condition]
1. a high frequency power applied to the lower electrode: 13.56 MHz, 300 W
2. a distance between the upper and the lower electrodes: 27 mm
3. a flow rate of the $O_2$ gas at the first pressure (20 mTorr): 50 sccm a residence time of the $O_2$ gas: 26.8 m/sec
4. a flow rate of the $O_2$ gas at the second pressure (200 mTorr): 900 sccm
   a. residence time of the $O_2$ gas: 14.9 m/sec
5. temperatures of T and W/B: 60° C./60° C.

Herein, T, W and B are the temperatures of the upper electrode, the wall portion of the chamber and the lower electrode, respectively.

6. a pressure of the backside gas (a center portion/a periphery portion): 7/40 Torr

EXAMPLE 2

In the present example, the first and the second pressures of the $O_2$ gas and the flow rate at each pressure were set to be identical to those of the example 1. The ashing of the PR film layer 202 and the BARC film layer 203 was performed first under the first pressure for duration of 60 seconds and then under the second pressure for duration of 2 minutes and 11 seconds. As a result, there was no crater generated around the contact hole 207 and the shoulder loss 207A of the contact hole 207 was 34.1 nm, which was greater than that of the example 1.

EXAMPLE 3

In the present example, the first and the second pressures of the $O_2$ gas and the flow rate at each pressure were set to be identical to those of the example 1. The ashing of the PR film layer 202 and the BARC film layer 203 was performed first under the first pressure for duration of 40 seconds and then under the second pressure for duration of 2 minutes and 27 seconds. Though indistinguishable craters were found around the contact hole 207, in comparison with conventional ashing the generation of the craters is significantly suppressed in the present example. Further, the shoulder loss 207A of the contact hole 207 was 29.5 nm, which was smaller than that of the example 1.

EXAMPLE 4

In the present example, the pressure of the $O_2$ gas was adjusted to 20 mTorr, i.e., the first pressure, and the flow rate thereof was set to be 50 sccm, as in the examples 1 to 3. The overashing of 340% was conducted under a pressure of 20 mTorr. As a result, no crater was generated around the contact hole 207 and the shoulder loss 207A of the contact hole 207 was 62 nm, which was greater than that of the example 1.

EXAMPLE 5

In the present example, the ashing was performed under the same conditions as in the example 4 with the exception of the flow rate of the $O_2$ gas being increased up to 150 sccm. The residence time was 8.9 m/sec. Under such conditions, no craters around the contact hole 207 were observed and the shoulder loss 207A of the contact hole 207 was 45 nm, which was smaller than that of the example 4.

EXAMPLE 6

In the present reference example, the ashing was conducted under the same conditions as in the example 3, with the exception of the flow rate of the $O_2$ gas being changed to 250 sccm. The residence time was 5.4 m/sec. When the ashing was finished, few craters around the contact hole 207 and the shoulder loss 207A of the contact hole 207 of 35.3 nm were observed. In this experiment, the generation of the craters was prevented much more effectively than in the conventional ashing process and the shoulder loss of the contact hole was smaller than those of the examples 4 and 5.

In preventing the generation of the craters, the residence time is preferably equal to or greater than 5 m/sec and, more preferably, equal to or greater than 10 m/sec. In the above examples, the first pressure was set to be 20 mTorr. However, it has been found that, even at the pressure of 60 mTorr, the shoulder loss was suppressed as in the above examples.

COMPARATIVE EXAMPLE 1

In the present comparative example, the PR film layer 202 and the BARC layer 203 were ashed by the conventional processing method. Specifically, the pressure and the flow rate of the $O_2$ gas were set to be 200 mTorr and 900 sccm, respectively, while performing the ashing for duration of 3 minutes with 340% overash. As a result, a number of deep and clear craters were formed around the contact hole 207 while producing the shoulder loss of the contact hole 207 of 18.8 nm, which was smaller than those of the above examples. In other experiments conducted while varying the overashed amount to 30%, 50%, 100%, and 200%, the demonstrable generation of the craters was observed with an increase in the amount of overash.

COMPARATIVE EXAMPLE 2

In the present comparative example, the ashing was performed under the above conditions with the exception of the flow rate of the $O_2$ gas being adjusted to 300 mTorr. The residence time of the O₂ gas was 44.7 m/sec. As a result, a number of craters deeper and clearer than those of the comparative example 1 were found.

Apart from the above examples and comparative examples an experiment was conducted in which a processing right until the ashing, was executed on a dummy wafer for use in evaluating metal contamination attached to a silicon oxide film thereof. When the dummy wafer was processed in the yttria-sprayed chamber used in the above examples, yttria contaminants were $10^{11}$ atoms/cm². In case of the yttria contaminants mounting to $10^{10}$ atoms/cm², generation of craters were observed. However, when the same dummy wafer was processed in the chamber which was not yttria-sprayed, the yttria contaminants were less than $4.3 \times 10^8$ atom/cm² (the lowest limit of measurement). In case of using such chamber, craters were not generated regardless of the pressure.

The inventors of the present invention examined causes of the craters generated after removing the PR film layer by performing ashing in the chamber having improved plasma resistance through the ceramic thermal spray treatment including the metallic component such as yttria. Based on the findings of the above examples and comparative examples, the inventors have arrived at following conclusions. While etching the SiO₂ film layer 104, a deposition film (deposition) (hereinafter, referred to as "DEPO") of etching by-product is formed in the chamber of which the inner surface is thermally sprayed with yttria, a kind of thermal spray of ceramic including the metallic component. Then the ashing of the PR film 102 is performed, at which time the DEPO along with yttrium and is accumulated on the wafer. After removing the PR film layer 102, the metallic component such as yttrium remains on the SiO₂ film layer 104 and such spots are selectively etched, so that the craters are formed thereat. Therefore, as a result of a series of processes while varying the process conditions of the process gas, e.g., the O₂ gas, as in the above examples, it has been found that, if the pressure of the process gas is set to be lower than that of the conventional one (those of the comparative examples), the generation of the craters can be suppressed, regardless of the DEPO dropping down to the PR film layer 102 including yttrium.

In the above examples, the SiO₂ film layer is formed beneath the PR film layer, but a SiOC (carbon-containing silicon oxide film) layer, a SiOF (fluorine-containing silicon oxide film) layer, a SiOH (hydrogen-containing silicon oxide film) layer, a SiN (silicon nitride film) layer, a ploy-silicon film layer, a metal film layer or the like may be formed in place thereof.

Further, the present invention is not limited to the above examples and can be applied to, e.g., when performing the yttria thermal spraying on another component in the chamber such as the upper electrode. The present invention further comprehends processing methods disclosing the following descriptions: when removing the organic film layer such as the PR film layer formed on a surface of an object to be processed in the vacuum processing vessel where the surface in contact with the plasma includes the metallic component, the pressure of the process gas including at least the O₂ gas is set to be much lower than the conventional pressure (e.g., 200 mTorr).

In accordance with the present invention, there is provided the processing method capable of noticeably preventing the craters from being generated at the lower film layer due to the abnormal etching, while removing the organic film layer from the lower film layer by performing the ashing in the vacuum processing vessel treated with the ceramic thermal spray including the metallic component, such as the yttria thermal spray, in order to enhance the plasma resistance.

What is claimed is:

1. A processing method for removing an organic film layer formed on a surface of an object to be processed by generating a plasma of a process gas in a vacuum processing vessel, comprising:

removing the organic film layer by employing the process gas under a first pressure in order to prevent generation of crater-shaped holes at the surface of the object, wherein the first pressure is set to be equal to or lower than 100 mTorr; and then removing the organic film layer by using the process gas under a second pressure in order to reduce a shoulder loss of an etched pattern produced on the surface of the object by using the organic film layer as a etching mask, wherein the second pressure is set to be higher than 100 mTorr.

2. The processing method of claim 1, wherein an overprocessing ratio of the organic film layer under the first pressure is set to be equal to or lower than 15% of 100% of the thickness of the organic film layer.

3. The processing method of claim 1, wherein a sum of an overprocessing ratio of the organic film layer under the first pressure and under the second pressure is set to be equal to or lower than 100% of 100% of the thickness of the organic film layer.

4. The processing method of claim 1, wherein the process gas includes at least an O₂ gas, but is essentially free of a fluorine-based gas.

5. The processing method of claim 4, wherein the O₂ gas is used as the process gas.

6. The processing method of claim 4, wherein a gaseous mixture of N₂ and O₂ is used as the process gas.

7. The processing method of claim 1, wherein the process gas includes at least one of N and H, but is essentially free of a fluorine-based gas.

8. The processing method of claim 1, wherein a portion of the vacuum processing vessel having contact with the plasma includes a metallic component.

9. The processing method of claim 8, wherein the metallic component is yttrium.

10. The processing method of claim 8, wherein the portion containing the metallic component is yttrium oxide.

11. The processing method of claim 1, wherein the organic film layer is a resist layer.

12. The processing method of claim 1, wherein a silicon oxide film layer is formed beneath the organic film layer.

13. The processing method of claim 12, wherein the silicon oxide film layer is one of a carbon-containing silicon oxide film layer, a fluorine-containing silicon oxide film layer and a hydrogen-containing silicon oxide film.

14. The processing method of claim 1, wherein one of a silicon nitride film layer, a polysilicon film layer and a metal film layer is formed beneath the organic film layer.

15. The processing method of claim 1, wherein the first pressure ranges from 20 to 50 mTorr.

16. The processing method of claim 1, wherein the second pressure ranges from 200 to 300 mTorr.

* * * * *